United States Patent
Berkovich (10) Patent No.: US 7,542,410 B2
(45) Date of Patent: Jun. 2, 2009

(54) INTERLEAVER AND ASSOCIATED METHODS

(75) Inventor: Miryam Berkovich, Herzila (IL)

(73) Assignee: Intel Corporation, Santa Clara, CA (US)

( * ) Notice: Subject to any disclaimer, the term of this patent is extended or adjusted under 35 U.S.C. 154(b) by 753 days.

(21) Appl. No.: 11/006,439

(22) Filed: Dec. 6, 2004

(65) Prior Publication Data

US 2006/0120311 A1    Jun. 8, 2006

(51) Int. Cl.
    *H04J 11/00*    (2006.01)
(52) U.S. Cl. .................. 370/208; 370/310; 370/335; 375/130; 714/701; 714/755
(58) Field of Classification Search .......... 370/208, 370/310, 335; 375/130; 714/701, 755
    See application file for complete search history.

(56) References Cited

U.S. PATENT DOCUMENTS

| | | | | |
|---|---|---|---|---|
| 4,901,319 | A * | 2/1990 | Ross | 714/788 |
| 6,637,000 | B2 | 10/2003 | Rowitch et al. | |
| 6,732,316 | B1 | 5/2004 | Tong et al. | |
| 6,747,948 | B1 | 6/2004 | Sarraf et al. | |
| 6,823,002 | B1 | 11/2004 | Betts | |
| 7,120,440 | B2 * | 10/2006 | Cho et al. | 455/441 |
| 7,310,324 | B2 * | 12/2007 | T | 370/335 |
| 2001/0053173 | A1 | 12/2001 | Toskala et al. | |
| 2006/0107174 | A1 * | 5/2006 | Heise | 714/755 |

FOREIGN PATENT DOCUMENTS

| | | | |
|---|---|---|---|
| EP | 0 998 046 A2 | 5/2000 | |
| EP | 1 420 519 A1 | 5/2004 | |
| TW | 158665 | 5/1991 | |
| TW | 584862 | 4/2004 | |

OTHER PUBLICATIONS

Tell, Eric, Dake Liu, A Hardware Architecture for a Multi Mode Block Interleaver, Linkoping University, Sweden.*
Peng, Xiaoming, AS Madhukumar, Francois P.S. Chin, Performance Studies of Interleaving Schemes for MC-CDMA Systems, Institute for Infocomm Research (I2R), School of Computer Engineering, Nanyang Technological University, Singapore.*
ETSI TS 125 212, Universal Mobile Telecommunications System (UMTS); Multiplexing and Channel Coding (FDD) (3GPP TS 25.212 version 6.0.0 Release 6) Technical Specification, 77 pages.
PCT/US2005/043731 Int'l Search Report & Written Opinion dated Mar. 28, 2006.

* cited by examiner

*Primary Examiner*—Ricky Ngo
*Assistant Examiner*—Luat Phung
(74) *Attorney, Agent, or Firm*—Kacvinsky LLC

(57) ABSTRACT

The present invention provides an improved method of generating blocks of data and partitioning the data into Columnar format N rows by M columns. The columnar format is generated by reading data into the format on a row-wise basis and reading data out of the columnar format on a column-wise basis. The interval between consecutively read columns is dynamically negotiated between transmitter and communicatively coupled receiver and greater than one (1). The invention further provides an improved apparatus and system comprising of an interleaver to partition data into the columnar format. The system comprises of one or more omnidirectional antenna(e), responsive to the interleaver, to facilitate transmission of a multicarrier symbol including the interleaved data to a remote device.

19 Claims, 3 Drawing Sheets

INTERLEAVER AND ASSOCIATED METHODS

TECHNICAL FIELD

Embodiments of the invention are generally directed to communication systems and, more particularly to an innovative interleaver and associated methods.

BACKGROUND

A multi-carrier communication system such as, e.g., Orthogonal Frequency Division Multiplexing (OFDM), Discrete Multi-tone (DMT) and the like, is typically characterized by a frequency band associated with a communication channel being divided into a number of smaller sub-bands (subcarriers herein). Communication of information (e.g., data, audio, video, etc.) between stations in such a multi-carrier communication system is performed by dividing the informational content into multiple pieces (e.g., symbols), and then transmitting a number of pieces in parallel via the separate subcarriers. When the symbol period transmitted through a is subcarrier is longer than a maximum multipath delay in the channel, the effect of intersymbol interference between the subcarriers may be significantly reduced.

Figure 1:
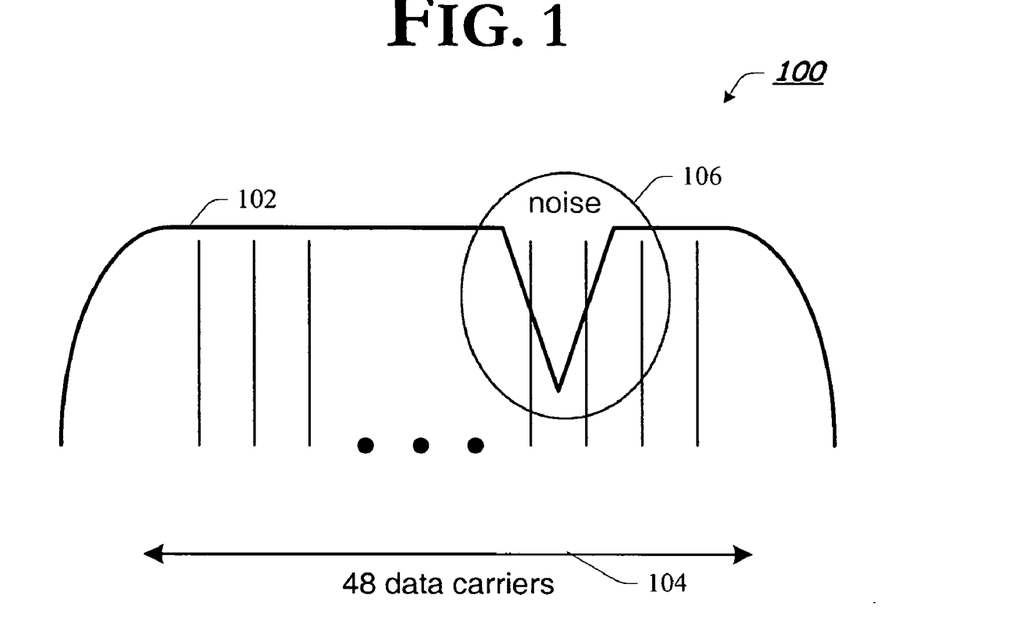
FIG. 1 is a graphical representation depicting the negative effect of noise, fading, etc. on a multi-carrier communication channel.

A limitation in any wireless communication system is the impairment of the channel as a result of fading, noise and the like, and multi-carrier communication channels are similarly susceptible to such problems. FIG. 1, for example, graphically depicts a multi-carrier communication channel 102, wherein a number of the total distribution of subcarriers 104 are adversely attenuated as a result of noise 106. One approach to try and mitigate the effect of random channel conditions such as noise and fading is to employ interleaving techniques.

Conceptually, an interleaver in a transmitter rearranges input data to spread-out contiguous data of an input data stream across multiple disparate blocks of data in an output data stream. Reversing this process, a de-interleaver in a receiver will rearrange the interleaved data back to the original sequence. In this regard, interleaving introduces a form of temporal diversity, separating information that was adjacent to one another in the original data stream across a number of blocks in the interleaved data stream. In so doing, bursts of errors that might otherwise result in lost packets at the receiver appear to the receiver as independent channel error, which may be readily handled through other error correction techniques.

Conventional interleaving techniques, however, may be insufficient at curbing the problems illustrated in FIG. 1. In a conventional IEEE 802.11a wireless communication system, for example, interleaving is performed by receiving content sequentially in a row-wise fashion into rows, and then iteratively reading out the content in a sequential, column-wise fashion (i.e., a read interval of one (1)). This interleaving technique results a subcarrier separation (or, span) of three (3) subcarriers between adjacent bits of the input signal. Given a subcarrier size of 312.5 KHz (in our 802.11a example), an instance of a noise signal that has a bandwidth of 937.5 KHz or greater (e.g., a 1 MHz Bluetooth signal within the same band) may adversely affect three (3) adjacent subcarriers, resulting in packet loss in the 802.11a receiver.

Thus, an improved interleaver architecture and related methods are required.

BRIEF DESCRIPTION OF THE DRAWINGS

Embodiments of the present invention are illustrated by way of example, and not by way of limitation, in the figures of the accompanying drawings in which like reference numerals refer to similar elements and in which.

DETAILED DESCRIPTION

Embodiments of an interleaver, deinterleaver and associated methods are generally described. In this regard, an innovative interleaver is presented suitable for use in a multi-carrier transceiver. According to but one embodiment, the interleaver may implement a method comprising partitioning received data into a columnar format of N rows by M columns, wherein the columnar format is generated by reading data into the format on a row-wise basis. To generate interleaved blocks of data, the interleaver may read the data out of the columnar format on a column-wise basis, wherein a read interval between consecutively read columns is greater than one (1), generating blocks of M elements (e.g., bits). The interleaver may then selectively assign the generated block of data to one of a plurality of subcarriers associated with a multicarrier communication channel. According to one embodiment, the number of subcarriers separating contiguous elements of received content (i.e., the span) is dynamically set at a value greater than three (3). According to one embodiment, the span is associated with the selected interval, although the invention need not be limited in this respect.

When implemented in a multiple input, multiple output (MIMO) transceiver architecture, the interleaver may further improves noise immunity of the multicarrier transmission channel by providing enhanced spatial interleaving through frequency rotation of the blocks assigned per sub-carrier on a per-transmit antenna basis.

In view of the disclosure below, it will be appreciated that embodiments of the innovative interleaver and associated methods are well-suited to implementation in multi-carrier wireless communication systems and, in particular to such systems that employ MIMO spatial diversity. In this regard, the interleaver and associated methods developed below are well-suited for implementation in an IEEE 802.11a, g and/or the developing n family of wireless local area network (WLAN) communication systems specified in, e.g., IEEE 802.11, 1999 Edition; Information Technology Telecommunications and Information Exchange Between Systems—Local and Metropolitan Area Networks—Specific Requirements, Part 11: WLAN Medium Access Control (MAC) and Physical (PHY) Layer Specifications; as well as the 802.11a and evolving 802.11n supplements thereto, the description of each of which is incorporated herein by reference.

In addition, the interleaver, deinterleaver and associated methods described herein may well be implemented within a communication system defined by IEEE Std 802.16-2001

IEEE Std. 802.16-2001 IEEE Standard for Local and Metropolitan area networks Part 16: Air Interface for Fixed Broadband Wireless Access Systems, and its progeny including, e.g., IEEE Std 802.16a-2003 (Amendment to IEEE Std 802.16-2001), the evolving 802.16e supplement and the like, the description of which is hereby incorporated herein by reference.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

EXAMPLE COMMUNICATION SYSTEM

Figure 2:
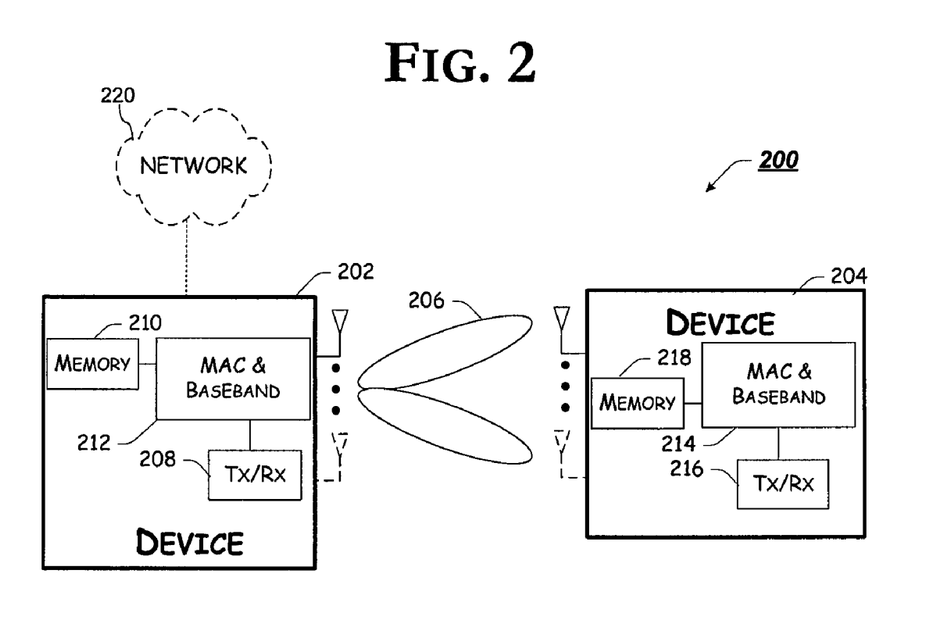
FIG. 2 is a block diagram of an example multicarrier wireless network incorporating the teachings of the present invention, according to one example embodiment.

Turning to FIG. 2, a block diagram of an example multi-carrier communication system is presented, according to one embodiment. As shown, network 200 depicts two devices 202, 204 each comprising one or more wireless transmitter(s) and receiver(s) (cumulatively, a transceiver) 208, 216, baseband and media access control (MAC) processing capability 212, 214, and memory 210, 218, each coupled as shown. As used herein, the devices 202, 204 selectively communicate information between one another via a multi-carrier wireless communication channel 206 established between the transceiver(s) 208, 216 through one or more antenna(e) associated with the devices. According to one embodiment, at least one of the devices (e.g., 202) may be coupled to another network 220, e.g., through one or more of a wireless and/or wireline communication medium.

According to one example embodiment, developed more fully below, the transceiver 208, 216 of devices 202, 204 may utilize an innovative interleaver/deinterleaver and associated methods to improve the devices' ability to mitigate noise, fading, etc. in the multi-carrier communication channel 206. According to one embodiment, described more fully below, when transmitting content to device 204, an interleaver in device 202 receives informational content (e.g., bits) (e.g., from a higher level application executing on device 202) in a columnar format described above. However, rather than reading content out of the format using the conventional read interval of one (1) (i.e., reading out consecutive columns of data), the interleaver may set a read interval greater than one (1), e.g., two (2) or more, an example of which is illustrated below It will be shown below that selection of a read interval of two may result in a subcarrier separation (or, frequency span) of twenty (20) or more subcarriers, e.g., depending on modulation rate, etc., although the invention is not limited in this regard. A read interval of eight (8) may result in a frequency span of six (6). According to one embodiment, the interval may be statically established in accordance with a communications standard, or it may be dynamically negotiated between a transmitter and communicatively coupled receiver based, at least in part, on a determination of current channel conditions. Alternatively, it may be dynamically determined by either the transmitter or the receiver and communicated to the other.

According to one embodiment, i.e., wherein a multiple-input, multiple-output (MIMO) architecture is employed thereby providing multiple spatial streams, the interleaver and deinterleaver introduced above may be logically "split" into multiple sections e.g., corresponding to the number of spatial streams (defined by the number of transmit antennae) employed. In such an embodiment, when interleaving several spatial streams, each interleaver, or interleaver section, may be rotated relative to the other interleaver(s). That is, each interleaver starts reading out data at a different point in the columnar format, while the interval and frequency span remain the same. This difference between the interleavers may be referred to as the frequency rotation.

An innovative deinterleaver in either device 202, 204 may perform the inverse operation of deinterleaving and frequency rotation of the content interleaved/rotated in the transmit process.

As used herein, the baseband and MAC processing element(s) 212, 214 may be implemented in one or more processors (e.g., a baseband processor and an application processor), although the invention is not limited in this regard. As shown, the processor element(s) 212, 214 may be coupled to memory 210, 218, respectively, which may include volatile memory such as DRAM, non-volatile memory such as Flash memory, or alternatively may include other types of storage such as a hard disk drive, although the cope of the invention is not limited in this respect. Some portion or all of memory 210, 218 may well be disposed within the same package as the processor element(s) 212, 214, or may be disposed on an integrated circuit or some other medium external to element(s) 212, 214.

According to one embodiment, baseband and MAC processing element(s) 212, 214 may implement at least a subset of the features of the innovative interleaver/deinterleaver and associated methods described below, and/or may provide control over a diversity agent implemented within an associated transceiver (208, 216), although the invention is not limited in this regard.

As used herein, but for the introduction of the interleaver, deinterleaver and associated methods developed more fully below, devices 202, 204 are intended to represent any of a wide range of electronic devices with wireless communication capability including, for example, a laptop, palmtop or desktop computer, a cellular telephone (e.g., a 2G, 2.5G, 3G or 4G handset), a personal digital assistant, an WLAN access point (AP), a WLAN station (STA), a wireless metropolitan area network (WMAN) subscriber station, WMAN basestation, and the like.

According to one embodiment, network 200 may represent any of a wide variety of communication systems including, but not limited to, a WLAN, WPAN, WMAN, etc. wherein one or more of device(s) 102, 104 may establish a wireless communication channel 206 in accordance with any one or more of the 802.11 or 802.16 family of specifications, although the invention is not limited in this regard.

As used herein, network 220 is intended to represent any of a broad range of communication networks including, for example a plain-old telephone system (POTS) communication network, a local area network (LAN), metropolitan area network (MAN), wide-area network (WAN), global area network (Internet), cellular network, and the like. According to one example implementation, device 202 represents an access point (AP), while device 204 represents a station (STA), each of which suitable for use within an IEEE 802.11n wireless local area network (WLAN), and each utilizing the innovative interleaving techniques introduced above, and developed more fully below.

EXAMPLE ARCHITECTURE(S)

Figure 3:
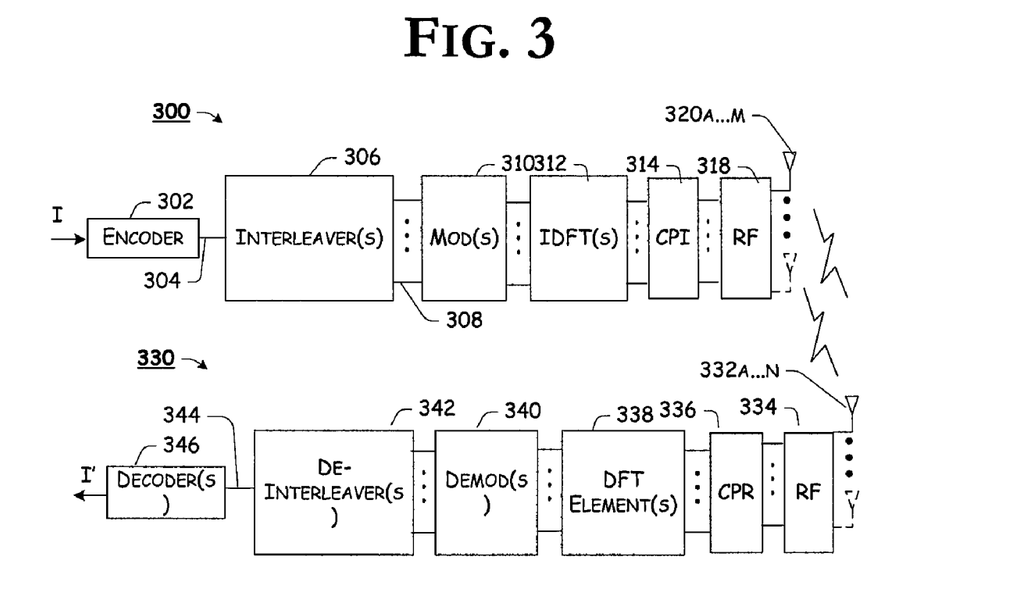
FIG. 3 is a block diagram of an example transceiver architecture incorporating an innovative interleaver, according to one example embodiment.

Turning to FIG. 3, a block diagram of an example transmitter architecture and an example receiver architecture are presented according to an example embodiment. To illustrate these architectures within the context of a communication between two devices, a transmitter 300 from one device (e.g., 202) and a receiver 330 from another device (e.g., 204) associated with a communication link are depicted. Those skilled in the art will appreciate that a transceiver in either device (202, 204) may well comprise the transmitter architecture and/or the receiver architecture as detailed in FIG. 2, although the scope of the invention is not limited in this regard. It should be appreciated that transmitter and receiver architectures of greater or lesser complexity that nonetheless implement the innovative interleaver, deinterleaver, or associated methods described herein are anticipated by the scope and spirit of the claimed invention.

According to the example embodiment of FIG. 3, transmitter 300 is depicted comprising one or more of encoder 302, interleaver(s) 306 incorporating elements of an embodiment of the invention, symbol mapper(s) 310, inverse discrete Fourier transform element(s) 312, cyclical prefix (or, guard interval) insertion element(s) 314, radio frequency (RF) processing element(s) 318 and two or more antenna(e) 320A ... M, each coupled as depicted. According to one embodiment, transmitter architecture 300 may be implemented within transceiver 208 and/or 216. Although depicted as a number of separate functional elements, those skilled in the art will appreciate that one or more elements of transmitter architecture 300 may well be combined into a multi-functional element, and conversely functional elements may be split into multiple functional elements without deviating from the scope of the invention.

In accordance with some embodiments, content for transmission may be presented to transmitter 300 in the form of a bit stream, although the invention is not limited in this regard. Encoder 302 may apply forward error correcting (FEC) codes to bit stream to generate a coded bit stream 304. The coded bit stream 304 may then be presented to an instance of one or more interleaver(s) 306, incorporating aspects of the present invention.

According to one example embodiment, interleaver 306 may perform an interleaving operation on a block of bits to generate interleaved block of bits 308. More particularly, in accordance with one embodiment of the invention, interleaver 306 may perform the interleaving operation using an extended interval and frequency spread to improve the noise immunity of the resulting multi-carrier communication channel. In addition, in MIMO implementations, interleaver 306 may introduce a frequency rotation in the interleaving process between the interleavers handling each of the spatial streams, thereby introducing another element of diversity into the resulting communications channel. In some embodiments, interleaver 306 may include a serial-to-parallel converter to generate a number (X) of interleaved, encoded bit streams 308 e.g., where X is associated with the number of subcarriers designated to carry the informational content described herein. Each of these elements will be developed more fully below, with reference to FIG. 4.

One or more modulators 310 may receive the interleaved content 308 and may individually modulate this content on corresponding subcarriers for each spatial channel. As used herein, the symbol-modulated subcarriers may comprise symbol-modulated subcarrier for each subcarrier of a spatial channel. A multi-carrier symbol, e.g., an OFDM symbol, may be represented by the combination of all symbol-modulated subcarriers. According to one embodiment, a number of individual modulators (e.g., one for each subcarrier) may symbol-modulate the interleaved content 308, while in other embodiments, one modulator may modulate the content 308 for all of the subcarriers.

Any one or more of a wide variety of modulation levels may be used including, but not limited to, binary phase shift keying (BPSK) which modulates one bit per symbol; quadrature phase shift keying (QPSK), which modulates two bits per symbol; 8 PSK, which modulates three bits per symbol; and any of a number of quadrature amplitude modulation (QAM), e.g., 16, 32, 64, 128, 256, etc. wherein four (16-QAM) to eight (256-QAM) bits are communicated per symbol, although the scope of the invention is not limited in this regard.

The modulated content is provided to one or more inverse discrete Fourier transform element(s) 312, which may generate a time domain representation of the symbol-modulated information content. It should be appreciated that almost any type of inverse discrete Fourier transform operation may be used. According to one embodiment, an inverse Fast Fourier transform technique is utilized by IDFT(s) 312. According to one embodiment, the number of IDFT element(s) employed may equal the number of subcarriers being generated, although greater or fewer number of element(s) may well be employed as the invention is not limited in s this respect. The number of time domain samples generated by IDFT(s) 312 may be equal to the number of frequency components input thereto. In some embodiments, IDFT(s) 312 may generate a time domain waveform for each spatial channel from the combination of symbol-modulated subcarriers for the respective spatial channel. According to one embodiment, IDFT(s) 312 may also convert the time domain samples generated to one or more serial symbol streams.

Cyclic prefix (or, guard interval) insertion element(s) 314 may add a cyclic extension to reduce inter-symbol interference in the resulting channel. Again, up to X cyclic prefix insertion element(s) 314 may be used, where X is the number of subcarriers to be generated, although the scope of the invention is not so limited.

As used herein, one or more radio frequency (RF) element(s) 316 may prepare each of the serial symbol streams for RF transmission. In this regard, RF element(s) 316 may include filters, amplifiers, modulators, and the like, although the invention is not limited in this regard. The RF processed signal is then applied to one or more antenna(e) 320A ... M. Any of a wide variety of directional and/or omnidirectional antenna(e) may be used including, for example, any one or more of monopole antennas, bipole antennas, loop antennas, microstrip antennas, or any other type of antenna suitable for transmission of RF signals. Thus, an embodiment of multi-carrier communication channel 206 is generated, according to one example embodiment of the present invention.

To extract content processed by a remote transmitter (e.g., 300), an example receiver architecture 330 is introduced. According to one example embodiment, receiver 330 is depicted comprising one or more of an radio frequency (RF) front end 334 responsive to the wireless communication channel 206 via one or more antenna(e) 332A ... N, cyclic prefix (or, guard interval) removal element(s) 336, discrete Fourier transform element(s) 338, de-modulator(s) 340, de-interleaver(s) 342 incorporating one or more aspects of the invention, and decoder(s) 346, each coupled as depicted to generate a representation (I') of the originally transmitted information (I).

Conceptually, the receiver architecture 330 reverses the transmit processing that took place in the remote transmitter 300. Of note for purposes here, the de-interleaver(s) 342 may receive interleaved encoded content from demodulator(s) 340, and reverses the interleaving process implemented by the remote interleaver(s) 306, as described more fully below. Deinterleaver(s) 342 may include a parallel-to-serial converter (not particular denoted) to generate a serial bit stream of de-interleaved, encoded content 344, which is passed to one or more decoder element(s) 346.

According to one embodiment, the interval and frequency rotation (if any) employed by the deinterleaver 342 may be set during manufacture of the deinterleaver. In another embodiment, the interval and frequency rotation may be dynamically set based, at least in part, on information received from the remote transmitter (300). In yet another embodiment, the deinterleaver 342 may dynamically set the interval and/or the frequency rotation based on perceived channel conditions. The receiver 330 may then cause the updated interval and frequency rotation information to be communicated back to the transmitter (300), for use in subsequent transmissions, although the invention is not limited in this respect.

Decoder(s) 346 perform forward error correction (FEC) decoding that is complementary to the encoding technique employed by encoder 302, to render a representation (I') of the originally received content (I).

EXAMPLE OPERATION

Figure 4:
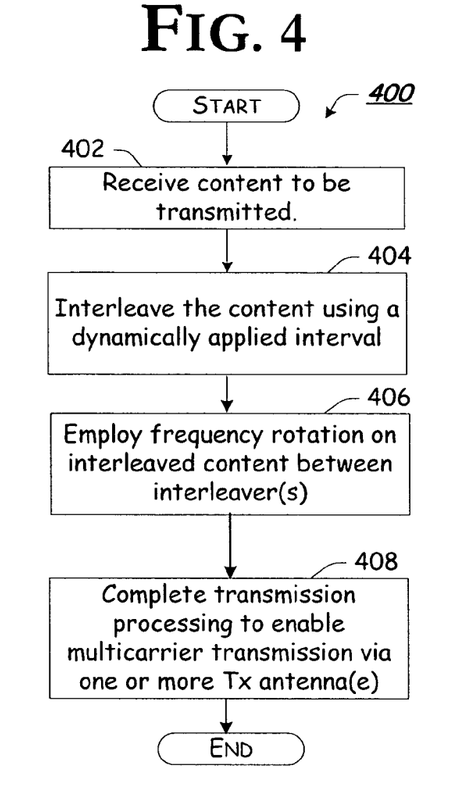
FIG. 4 is a flow chart of an example method for interleaving information content for transmission along a multicarrier communication channel, according to one embodiment.
Figure 5:
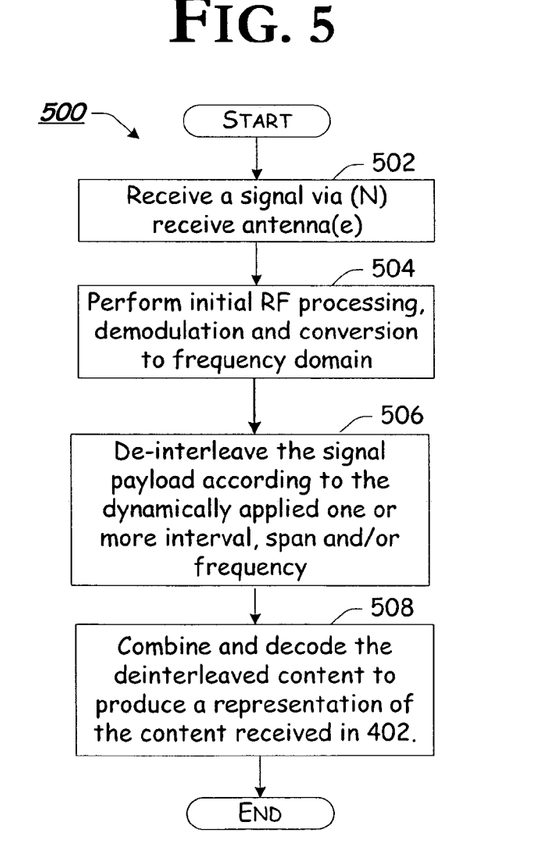
FIG. 5 is a flow chart of an example method for processing received signals generated according to the method of FIG. 4, according to one example embodiment.

Having introduced an example operating environment (FIG. 2) and an example transceiver architecture (FIG. 3) within which the teachings of the invention may well be practiced, attention is now directed to FIGS. 4 and 5, wherein an example interleaving and de-interleaving technique will be further developed, according to but one example embodiment of the invention. For ease of illustration, and not limitation, the technique(s) of FIGS. 4 and 5 will be developed with continued consideration of the network and architecture(s) of FIGS. 2 and 3, respectively, although the invention is not limited in this regard.

Turning to FIG. 4, a flow chart of an example method for interleaving informational content is presented, according to but one example embodiment. In accordance with the illustrated example embodiment of FIG. 4, an interleaving method may begin with block 402, wherein an interleaver receives content to be transmitted. As introduced above, an interleaver (306) may receive an FEC encoded bit stream 304 from an encoder 302.

In block 404, the interleaver (306) may interleave the content using an extended interval. More particularly, the interleaver (306) may partition the received encoded bit stream into a columnar format of N rows by M columns, wherein the columnar format is generated by reading data into the format on a row-wise basis. For purposes of illustration, and not limitation, consider the following representation of an encoded bit stream: A, B, C, D, . . . , L. According to one embodiment, the interleaver will generate a columnar format reading such content in a row-wise fashion resulting in the following format:

$$A \quad B \quad C \quad D \tag{1}$$
$$E \quad F \quad G \quad H$$
$$I \quad J \quad K \quad L$$

A conventional interleaver such as, e.g., the 802.11a standard interleaver, would read data out of the columnar format in a sequential, column-wise fashion, generating an interleaved bit-stream such as A, E, I, B, F, J, C, G, K, D, H, L . . . with a corresponding frequency span of three (3).

In contradistinction, the innovative interleaver (306) sets an interval greater than one (1), which will result in increased frequency span between otherwise contiguous data elements. For example, an interval of two (2) will result in a frequency span of about twenty (20), while an interval of seven (7) will result in a frequency span of six (6). The difference between a convention interleaver (employing an interval of one) and the innovative interleaver described herein is perhaps easiest to appreciate when considering the content presented to the deinterleaver for each of the two implementations. Using a conventional interleaver, the data associated with the forty-eight (48) subcarriers (represented Dx) may be represented as:

$$\begin{array}{cccccccccccccccc} D_0 & D_3 & D_6 & D_9 & D_{12} & D_{15} & D_{18} & D_{21} & D_{24} & D_{27} & D_{30} & D_{33} & D_{36} & D_{39} & D_{42} & D_{45} \\ D_1 & D_4 & D_7 & D_{10} & D_{13} & D_{16} & D_{19} & D_{22} & D_{25} & D_{28} & D_{31} & D_{34} & D_{37} & D_{40} & D_{43} & D_{46} \\ D_2 & D_5 & D_8 & D_{11} & D_{14} & D_{17} & D_{20} & D_{23} & D_{26} & D_{29} & D_{32} & D_{35} & D_{38} & D_{41} & D_{44} & D_{47} \end{array} \tag{2}$$

Such that the data, when read out of the format would be:

$$D_0\, D_3\, D_6\, D_9\, D_{12}\, D_{15}\, D_{18}, \ldots, D_{47} \tag{3}$$

As can be seen, the data over sub-carriers 0 and 3 is consecutive such that an attenuation of three adjacent sub-carriers could result in data loss.

Using the innovative interleaver described herein, however, with an interval of (2), i.e., filling every other column until all the columns are generated provides the following:

$$\begin{array}{cccccccccccccccc} D_0 & D_{24} & D_3 & D_{27} & D_6 & D_{30} & D_9 & D_{33} & D_{12} & D_{36} & D_{15} & D_{39} & D_{18} & D_{42} & D_{21} & D_{45} \\ D_1 & D_{25} & D_4 & D_{28} & D_7 & D_{31} & D_{10} & D_{34} & D_{13} & D_{37} & D_{16} & D_{40} & D_{19} & D_{43} & D_{22} & D_{46} \\ D_2 & D_{26} & D_5 & D_{29} & D_8 & D_{32} & D_{11} & D_{34} & D_{14} & D_{38} & D_{17} & D_{41} & D_{20} & D_{44} & D_{23} & D_{47} \end{array} \tag{4}$$

From which the deinterleaver will see the following sequence:

$$D_0\, D_{24}\, D_3\, D_{27}\, D_6\, D_{30}, \ldots, D_{47} \tag{5}$$

Thus, the continguous input data is separated by 25 subcarriers in the interleaved format and as such, an attenuation of 3 adjacent sub-carriers should not pose a problem for the decoder(s).

In block 406, for transmitter architectures that generate two or more spatial streams (e.g., a MIMO implementation), the interleaver (306) may utilize frequency rotation between the interleaved data generated for the disparate spatial streams. According to one example embodiment with two transmit spatial streams, for example, the interleaver (306) may be split into two logical sections, one for each spatial stream. The interleaver associated with the first spatial stream will utilize the columnar format (4), resulting in a data interleaved data stream at the receiver corresponding to data stream (5).

The second interleaver section may utilize the following, frequency shifted (or, rotated) version of format (4) representing a rotation of nine (9) columns, although the scope of the invention is not so limited:

$$D_{12}\ D_{36}\ D_{15}\ D_{39}\ D_{18}\ D_{42}\ D_{21}\ D_{45}\ D_0\ D_{24}\ D_3\ D_{27}\ D_6\ D_{30}\ D_9\ D_{33}$$
$$D_{13}\ D_{37}\ D_{16}\ D_{40}\ D_{19}\ D_{43}\ D_{22}\ D_{46}\ D_1\ D_{25}\ D_4\ D_{28}\ D_7\ D_{31}\ D_{10}\ D_{34}$$
$$D_{14}\ D_{38}\ D_{17}\ D_{41}\ D_{20}\ D_{44}\ D_{23}\ D_{47}\ D_2\ D_{26}\ D_5\ D_{29}\ D_8\ D_{31}\ D_{11}\ D_{34} \quad (6)$$

Accordingly, the data presented to the deinterleaver associated with this second spatial stream would be as follows, although the invention is not so limited:

$$D_{12}\ D_{36}\ D_{15}\ D_{39}\ D_{18}\ D_{42}\ D_{21}\ D_{45}\ D_0\ D_{24}, \ldots, D_{34} \quad (7)$$

In block 408, the interleaved content is presented to subsequent elements 310-318 of transmitter 300 for processing in the generation of a multi-carrier communication channel, 206.

With reference now to FIG. 5, a flow chart of an example method for receive processing a multi-carrier signal generated according to FIG. 4 is presented, according to one example embodiment. In accordance with the example embodiment of FIG. 5, the method begins with block 502, wherein a receiver (330) receives one or more instances of one or more spatial streams generated by a remote transmitter (e.g., 300) via one or more receive antenna(e) (332A ... N).

In block 504, the receiver (330) may perform initial RF processing (334), demodulation (336) and conversion to the frequency domain (338), although the scope of the invention is not so limited.

In block 506, a deinterleaver (342) receives content essentially appearing as provided above, in sequences (4) and/or (6), although the invention is not so limited. That is, in the case of a single spatial stream (e.g., a SISO implementation), the deinterleaver (342) may receive an interleaved data sequence according to sequence (4) above if the interleaver (306) employed an interval of 2 resulting in a frequency span of 25. Reversing the interleaving process performed by interleaver (306), given the interval and frequency span information, deinterleaver (342) generates a deinterleaved, encoded data sequence (344) for processing by decoders (346).

If more than one spatial stream is used (e.g., in a MIMO implementation), the deinterleaver (342) may be divided into multiple logical elements, each associated with the number of received spatial streams. Each of the logical deinterleaver(s) (342) will perform deinterleaving, as above. In addition, the second deinterleaver will perform a frequency rotation to counteract the shift performed by the interleaver that generated the associated spatial stream.

In block 508, the deinterleaved sequence(s) (344) are combined and decoded (346) to produce a representation (I') of the content (I) originally presented to the remote transmitter (300).

It should be appreciated, based on the foregoing, that an innovative interleaver and associated methods for introducing extensible temporal and spatial diversity into a multi-carrier communication channel has been introduced.

ALTERNATE EMBODIMENT(s)

Figure 6:
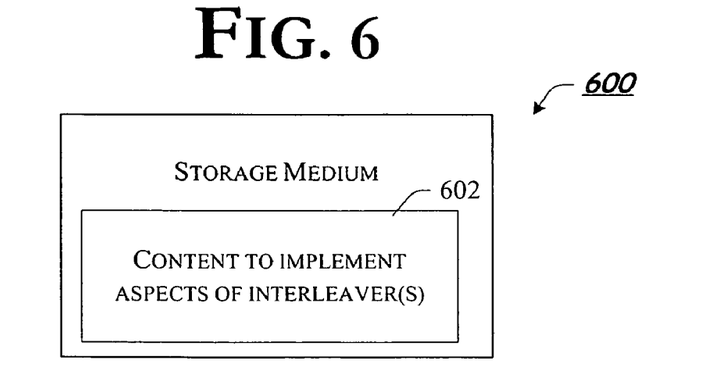
FIG. 6 is a block diagram of an example storage medium comprising content which, when executed, causes an executing device to implement one or more aspects of an innovative interleaver, or methods associated therewith, according to but one example embodiment.

FIG. 6 illustrates a block diagram of an example storage medium comprising content which, when invoked, may cause an accessing machine to implement one or more aspects of the innovative interleaver/deinterleaver (302, 342) and/or associated methods (400, 500). In this regard, storage medium 600 may include content 602 (e.g., instructions, data, or any combination thereof) which, when executed, causes an accessing appliance to implement one or more aspects of the interleaver/deinterleaver described above.

The machine-readable (storage) medium 600 may include, but is not limited to, floppy diskettes, optical disks, CD-ROMs, and magneto-optical disks, ROMs, RAMs, EPROMs, EEPROMs, magnet or optical cards, flash memory, or other type of media/machine-readable medium suitable for storing electronic instructions. Moreover, the present invention may also be downloaded as a computer program product, wherein the program may be transferred from a remote computer to a requesting computer by way of data signals embodied in a carrier wave or other propagation medium via a communication link (e.g., a modem, radio or network connection). As used herein, all of such media is broadly considered storage media.

It should be understood that embodiments of the present invention may be used in a variety of applications. Although the present invention is not limited in this respect, the circuits disclosed herein may be used in many apparatuses such as in the transmitters and receivers of a radio system. Radio systems intended to be included within the scope of the present invention include, by way of example only, wireless local area networks (WLAN) devices and wireless wide area network (WWAN) devices including wireless network interface devices and network interface cards (NICs), base stations, access points (APs), gateways, bridges, hubs, cellular radiotelephone communication systems, satellite communication systems, two-way radio communication systems, one-way pagers, two-way pagers, personal communication systems (PCS), personal computers (PCs), personal digital assistants (PDAs), sensor networks, personal area networks (PANs) and the like, although the scope of the invention is not limited in this respect.

The types of wireless communication systems intended to be within the scope of the present invention include, although not limited to, Wireless Local Area Network (WLAN), Wireless Wide Area Network (WWAN), Code Division Multiple Access (CDMA) cellular radiotelephone communication systems, Global System for Mobile Communications (GSM) cellular radiotelephone systems, North American Digital Cellular (NADC) cellular radiotelephone systems, Time Division Multiple Access (TDMA) systems, Extended-TDMA (E-TDMA) cellular radiotelephone systems, third generation (3G) systems like Wide-band CDMA (WCDMA), CDMA-2000, and the like, although the scope of the invention is not limited in this respect.

Embodiments of the present invention may also be included in integrated circuit blocks referred to as core memory, cache memory, or other types of memory that store electronic instructions to be executed by the microprocessor or store data that may be used in arithmetic operations. In general, an embodiment using multistage domino logic in accordance with the claimed subject matter may provide a benefit to microprocessors, and in particular, may be incorporated into an address decoder for a memory device. Note that the embodiments may be integrated into radio systems or hand-held portable devices, especially when devices depend on reduced power consumption. Thus, laptop computers, cellular radiotelephone communication systems, two-way radio communication systems, one-way pagers, two-way pagers, personal communication systems (PCS), personal digital assistants (PDA's), cameras and other products are intended to be included within the scope of the present invention.

The present invention includes various operations. The operations of the present invention may be performed by hardware components, or may be embodied in machine-executable content (e.g., instructions), which may be used to cause a general-purpose or special-purpose processor or logic circuits programmed with the instructions to perform the operations. Alternatively, the operations may be performed by a combination of hardware and software. Moreover, although the invention has been described in the context of a computing appliance, those skilled in the art will appreciate that such functionality may well be embodied in any of number of alternate embodiments such as, for example, integrated within a communication appliance (e.g., a cellular telephone).

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. Any number of variations of the inventive concept are anticipated within the scope and spirit of the present invention. In this regard, the particular illustrated example embodiments are not provided to limit the invention but merely to illustrate it. Thus, the scope of the present invention is not to be determined by the specific examples provided above but only by the plain language of the following claims.

What is claimed is:

1. A method of generating blocks of data, the method comprising:

determining current conditions for a channel;

partitioning data into a columnar format of N rows by M columns, wherein the columnar format is generated by writing data into the format on a row-wise basis;

creating a number of different versions of the columnar format, one each associated with a number of spatial streams to be generated, wherein the difference between the versions of the columnar format is a frequency shift in the columns between the versions;

reading data out of the columnar format on a column-wise basis, wherein a read interval between consecutively read columns is greater than one (1) and said interval is dynamically negotiated between a transmitter and a communicatively coupled receiver based, at least in part, on said determination;

generating a block of data from a number M of the read data; and assigning the block of data to one of a plurality of subcarriers associated with a multicarrier communication channel, wherein a span between subcarriers for adjacent blocks of data is greater than three (3).

2. A method according to claim 1, wherein an interval of two (2) results creates a frequency span greater than three (3).

3. A method according to claim 2, wherein the frequency span is twenty-five (25).

4. A method according to claim 1, the frequency rotated, columnar format created for a second spatial stream comprising:

$$D_{12}\ D_{36}\ D_{15}\ D_{39}\ D_{18}\ D_{42}\ D_{21}\ D_{45}\ D_0\ D_{24}\ D_3\ D_{27}\ D_6\ D_{30}\ D_9\ D_{33}$$
$$D_{13}\ D_{37}\ D_{16}\ D_{40}\ D_{19}\ D_{43}\ D_{22}\ D_{46}\ D_1\ D_{25}\ D_4\ D_{28}\ D_7\ D_{31}\ D_{10}\ D_{34}$$
$$D_{14}\ D_{38}\ D_{17}\ D_{41}\ D_{20}\ D_{44}\ D_{23}\ D_{47}\ D_2\ D_{26}\ D_5\ D_{29}\ D_8\ D_{31}\ D_{11}\ D_{34};$$

when the columnar format associated with the first spatial stream is:

$$D_0\ D_{24}\ D_3\ D_{27}\ D_6\ D_{30}\ D_9\ D_{33}\ D_{12}\ D_{36}\ D_{15}\ D_{39}\ D_{18}\ D_{42}\ D_{21}\ D_{45}$$
$$D_1\ D_{25}\ D_4\ D_{28}\ D_7\ D_{31}\ D_{10}\ D_{34}\ D_{13}\ D_{37}\ D_{16}\ D_{40}\ D_{19}\ D_{43}\ D_{22}\ D_{46}$$
$$D_2\ D_{26}\ D_5\ D_{29}\ D_8\ D_{32}\ D_{11}\ D_{34}\ D_{14}\ D_{38}\ D_{17}\ D_{41}\ D_{20}\ D_{44}\ D_{23}\ D_{47}.$$

5. A method according to claim 4, wherein the data read out of the columnar format associated with the second spatial stream comprises:

$$D_{12}\ D_{36}\ D_{15}\ D_{39}\ D_{18}, \ldots, D_{34}$$

while the data read out of the columnar format associated with the first spatial stream comprises:

$$D_0\ D_{24}\ D_3\ D_{27}\ D_6\ D_{30}\ D_9, \ldots, D_{47}.$$

6. A method according to claim 1, the columnar format associated with a multi-carrier symbol comprising:

$D_0\ D_{24}\ D_3\ D_{27}\ D_6\ D_{30}\ D_9\ D_{33}\ D_{12}\ D_{36}\ D_{15}\ D_{39}\ D_{18}\ D_{42}\ D_{21}\ D_{45}$ $D_1\ D_{25}\ D_4\ D_{28}\ D_7\ D_{31}\ D_{10}\ D_{34}\ D_{13}\ D_{37}\ D_{16}\ D_{40}\ D_{19}\ D_{43}\ D_{22}\ D_{46}$ $D_2\ D_{26}\ D_5\ D_{29}\ D_8\ D_{32}\ D_{11}\ D_{34}\ D_{14}\ D_{38}\ D_{17}\ D_{41}\ D_{20}\ D_{44}\ D_{23}\ D_{47}$.

7. A method according to claim 6, the data read out of the columnar format associated with the multi-carrier symbol comprising:

$D_0\ D_{24}\ D_3\ D_{27}\ D_6\ D_{30}\ D_9, \ldots, D_{47}$.

8. An apparatus comprising:
An interleaver, to partition data into a columnar format of N rows by M columns, wherein the columnar format is generated by writing data into the format on a row-wise basis, the interleaver generates a number of different versions of the columnar format, one each associated with a number of spatial streams to be generated, wherein the difference between the versions of the columnar format is a frequency shift in the columns between the versions; and
reading data out of the columnar format on a column-wise basis, wherein a read interval between consecutively read columns is greater than one (1) and said interval is dynamically negotiated between a transmitter and a communicatively coupled receiver based, at least in part, on current conditions for a channel, the interleaver generates a block of data from a number M of the read data; and assigns the block of data to one of a plurality of subcarriers associated with a multicarrier communication channel, wherein a span between subcarriers for adjacent blocks of data is greater than three (3).

9. An apparatus according to claim 8, wherein the interleaver utilizes an interval of two (2) resulting in a frequency span between otherwise contiguous data elements greater than three (3).

10. An apparatus according to claim 9, wherein the frequency span is twenty-five (25).

11. An apparatus according to claim 8, wherein the columnar format associated with one multi-carrier symbol created by the interleaver for a second spatial stream comprising:

$D_{12}\ D_{36}\ D_{15}\ D_{39}\ D_{18}\ D_{42}\ D_{21}\ D_{45}\ D_0\ D_{24}\ D_3\ D_{27}\ D_6\ D_{30}\ D_9\ D_{33}$ $D_{13}\ D_{37}\ D_{16}\ D_{40}\ D_{19}\ D_{43}\ D_{22}\ D_{46}\ D_1\ D_{25}\ D_4\ D_{28}\ D_7\ D_{31}\ D_{10}\ D_{34}$ $D_{14}\ D_{38}\ D_{17}\ D_{41}\ D_{20}\ D_{44}\ D_{23}\ D_{47}\ D_2\ D_{26}\ D_5\ D_{29}\ D_8\ D_{31}\ D_{11}\ D_{34}$, when the columnar format associated with the first spatial stream is:

$D_0\ D_{24}\ D_3\ D_{27}\ D_6\ D_{30}\ D_9\ D_{33}\ D_{12}\ D_{36}\ D_{15}\ D_{39}\ D_{18}\ D_{42}\ D_{21}\ D_{45}$ $D_1\ D_{25}\ D_4\ D_{28}\ D_7\ D_{31}\ D_{10}\ D_{34}\ D_{13}\ D_{37}\ D_{16}\ D_{40}\ D_{19}\ D_{43}\ D_{22}\ D_{46}$ $D_2\ D_{26}\ D_5\ D_{29}\ D_8\ D_{32}\ D_{11}\ D_{34}\ D_{14}\ D_{38}\ D_{17}\ D_{41}\ D_{20}\ D_{44}\ D_{23}\ D_{47}$; and wherein D represents the data associated with subcarrier x.

12. An apparatus according to claim 11, wherein the data read out of the columnar format associated with the second spatial stream comprises:

$D_{12}\ D_{36}\ D_{15}\ D_{39}\ D_{18}, \ldots, D_{34}$, while the data read out of the columnar format associated with the first spatial stream comprises:

$D_0\ D_{24}\ D_3\ D_{27}\ D_6\ D_{30}\ D_9, \ldots, D_{47}.$

13. An apparatus according to claim 8, wherein the interleaver partitions data into a columnar format associated with a multi-carrier symbol as:

$D_0\ D_{24}\ D_3\ D_{27}\ D_6\ D_{30}\ D_9\ D_{33}\ D_{12}\ D_{36}\ D_{15}\ D_{39}\ D_{18}\ D_{42}\ D_{21}\ D_{45}$ $D_1\ D_{25}\ D_4\ D_{28}\ D_7\ D_{31}\ D_{10}\ D_{34}\ D_{13}\ D_{37}\ D_{16}\ D_{40}\ D_{19}\ D_{43}\ D_{22}\ D_{46}$ $D_2\ D_{26}\ D_5\ D_{29}\ D_8\ D_{32}\ D_{11}\ D_{34}\ D_{14}\ D_{38}\ D_{17}\ D_{41}\ D_{20}\ D_{44}\ D_{23}\ D_{47}.$

14. An apparatus according to claim 13, wherein the interleaver reads data out of the columnar format associated with the multi-carrier symbol as:

$D_0\ D_{24}\ D_3\ D_{27}\ D_6\ D_{30}\ D_9, \ldots, D_{47}.$

15. A system comprising:
an interleaver, to partition data into a columnar format of N rows by M columns, wherein the columnar format is generated by writing data into the format on a row-wise basis, and to read data out of the columnar format on a column-wise basis, wherein a read interval between consecutively read columns is greater than one (1) and said interval is dynamically negotiated between a transmitter and a communicatively coupled receiver based, at least in part, on current conditions for a channel, the interleaver creates a number of different versions of the columnar format, one each associated with a number of spatial streams to be generated, wherein the difference between the versions of the columnar format is a frequency shift in the columns between the created versions, the interleaver generates a block of data from a number M of the read data and assigns the block of data to one of a plurality of subcarriers associated with a multicarrier communication channel, wherein a span between subcarriers for adjacent blocks of data is greater than three (3); and
one or more omnidirectional antenna(e), responsive to the interleaver, to facilitate transmission of the a multi-carrier symbol including the interleaved data to a remote device.

16. A system according to claim 15, wherein the columnar format associated with one multi-carrier symbol created by the interleaver for a second spatial stream comprising:

$D_{12}\ D_{36}\ D_{15}\ D_{39}\ D_{18}\ D_{42}\ D_{21}\ D_{45}\ D_0\ D_{24}\ D_3\ D_{27}\ D_6\ D_{30}\ D_9\ D_{33}$ $D_{13}\ D_{37}\ D_{16}\ D_{40}\ D_{19}\ D_{43}\ D_{22}\ D_{46}\ D_1\ D_{25}\ D_4\ D_{28}\ D_7\ D_{31}\ D_{10}\ D_{34}$ $D_{14}\ D_{38}\ D_{17}\ D_{41}\ D_{20}\ D_{44}\ D_{23}\ D_{47}\ D_2\ D_{26}\ D_5\ D_{29}\ D_8\ D_{31}\ D_{11}\ D_{34},$ when the columnar format associated with the first spatial stream is:

$D_0\ D_{24}\ D_3\ D_{27}\ D_6\ D_{30}\ D_9\ D_{33}\ D_{12}\ D_{36}\ D_{15}\ D_{39}\ D_{18}\ D_{42}\ D_{21}\ D_{45}$ $D_1\ D_{25}\ D_4\ D_{28}\ D_7\ D_{31}\ D_{10}\ D_{34}\ D_{13}\ D_{37}\ D_{16}\ D_{40}\ D_{19}\ D_{43}\ D_{22}\ D_{46}$ $D_2\ D_{26}\ D_5\ D_{29}\ D_8\ D_{32}\ D_{11}\ D_{34}\ D_{14}\ D_{38}\ D_{17}\ D_{41}\ D_{20}\ D_{44}\ D_{23}\ D_{47};$ and wherein D represents the data associated with subcarrier x.

17. A system according to claim 16, wherein the data read out of the columnar format associated with the second spatial stream comprises:

$D_{12}\ D_{36}\ D_{15}\ D_{39}\ D_{18}, \ldots, D_{34},$ while the data read out of the columnar format associated with the first spatial stream comprises:

$D_0\ D_{24}\ D_3\ D_{27}\ D_6\ D_{30}\ D_9, \ldots, D_{47}.$

18. A system according to claim 15, wherein the interleaver partitions data into a columnar format associated with a multi-carrier symbol as:

$D_0 \quad D_{24} \quad D_3 \quad D_{27} \quad D_6 \quad D_{30} \quad D_9 \quad D_{33} \quad D_{12} \quad D_{36} \quad D_{15} \quad D_{39} \quad D_{18} \quad D_{42} \quad D_{21} \quad D_{45}$ $D_1 \quad D_{25} \quad D_4 \quad D_{28} \quad D_7 \quad D_{31} \quad D_{10} \quad D_{34} \quad D_{13} \quad D_{37} \quad D_{16} \quad D_{40} \quad D_{19} \quad D_{43} \quad D_{22} \quad D_{46}$ $D_2 \quad D_{26} \quad D_5 \quad D_{29} \quad D_8 \quad D_{32} \quad D_{11} \quad D_{34} \quad D_{14} \quad D_{38} \quad D_{17} \quad D_{41} \quad D_{20} \quad D_{44} \quad D_{23} \quad D_{47}.$ 19. A system according to claim 18, wherein the interleaver reads data out of the columnar format associated with the multi-carrier symbol as:

$D_0 \, D_{24} \, D_3 \, D_{27} \, D_6 \, D_{30} \, D_9, \ldots, D_{47}.$

* * * * *

UNITED STATES PATENT AND TRADEMARK OFFICE
CERTIFICATE OF CORRECTION

PATENT NO. : 7,542,410 B2  Page 1 of 1
APPLICATION NO. : 11/006439
DATED : June 2, 2009
INVENTOR(S) : Miryam Berkovich It is certified that error appears in the above-identified patent and that said Letters Patent is hereby corrected as shown below:

On the Title page, in Item (57), under "Abstract", in column 2, line 3, delete "format N" and insert -- format of N --, therefor.

In column 13, line 22, in Claim 8, delete "An" and insert -- an --, therefor.

In column 16, line 29, in Claim 15, delete "the a" and insert -- the --, therefor.

Signed and Sealed this

Twenty-third Day of March, 2010

David J. Kappos
*Director of the United States Patent and Trademark Office*